United States Patent

Konno

(10) Patent No.: US 8,263,315 B2
(45) Date of Patent: Sep. 11, 2012

(54) PATTERN-FORMING METHOD

(75) Inventor: Keiji Konno, Tokyo (JP)

(73) Assignee: JSR Corporation, Tokyo (JP)

(*) Notice: Subject to any disclaimer, the term of this patent is extended or adjusted under 35 U.S.C. 154(b) by 2 days.

(21) Appl. No.: 12/814,476

(22) Filed: Jun. 13, 2010

(65) Prior Publication Data

US 2010/0248167 A1 Sep. 30, 2010

Related U.S. Application Data

(63) Continuation of application No. PCT/JP2008/066448, filed on Sep. 11, 2008.

(30) Foreign Application Priority Data

Dec. 14, 2007 (JP) ................................ 2007-323349

(51) Int. Cl.
G03F 7/20 (2006.01)
G03F 7/30 (2006.01)
G03F 7/40 (2006.01)
G03F 7/42 (2006.01)

(52) U.S. Cl. ........ 430/311; 430/312; 430/313; 430/324; 430/326; 430/328; 430/329; 430/330

(58) Field of Classification Search .................. None
See application file for complete search history.

(56) References Cited

U.S. PATENT DOCUMENTS

| 7,378,229 | B2 * | 5/2008 | Endo et al. ................ 430/322 |
| 2002/0036183 | A1 | 3/2002 | Shibata |
| 2005/0123858 | A1 | 6/2005 | Ito et al. |
| 2008/0305443 | A1 * | 12/2008 | Nakamura ................ 430/325 |

FOREIGN PATENT DOCUMENTS

| JP | 5-232704 | 9/1993 |
| JP | 07-130631 | 5/1995 |
| JP | 10-303114 | 11/1998 |
| JP | 2001-343757 | 12/2001 |
| JP | 2002-110510 | 4/2002 |
| JP | 2002-214777 | 7/2002 |
| JP | 2003-077922 | 3/2003 |
| JP | 2004-335873 | 11/2004 |
| JP | 2005-129761 | 5/2005 |
| JP | 2007-293294 | 11/2007 |
| WO | WO 2007/142209 | 12/2007 |

OTHER PUBLICATIONS

International Search Report for corresponding International Application No. PCT/JP2008/066448, Oct. 7, 2008.

(Continued)

Primary Examiner — Sin J. Lee
(74) Attorney, Agent, or Firm — Ditthavong Mori & Steiner, P.C.

(57) ABSTRACT

A pattern-forming method includes selectively exposing a resist layer formed using a positive-tone radiation-sensitive resin composition including a resin component and an acid generator. The resist layer is developed to form a first pattern. An uncrosslinked embedded section is formed adjacent the first the pattern using a pattern-forming resin composition including a polymer. The polymer has a carbon content higher than that of the resin component, does not include silicon atom in a molecule, and is crosslinkable due to an acid generated from the acid generator. The uncrosslinked embedded section is crosslinked in an area around an interface with the first pattern to form an array structure. The first pattern, a first crosslinked section, the uncrosslinked embedded section, and a second crosslinked section are repeatedly arranged in the array structure in this order. The first pattern and the uncrosslinked embedded section are removed to form a second pattern.

15 Claims, 4 Drawing Sheets

OTHER PUBLICATIONS

International Preliminary Report on Patentability with Translation of Written Opinion of the International Searching Authority for corresponding International Application No. PCT/JP2008/066448, Jul. 20, 2010.

* cited by examiner

PATTERN-FORMING METHOD

CROSS-REFERENCE TO RELATED APPLICATIONS

The present application is a continuation application of International Application No. PCT/JP2008/066448, filed Sep. 11, 2008, which claims priority to Japanese Patent Application No. 2007-323349, filed Dec. 14, 2007. The contents of these applications are incorporated herein by reference in their entirety.

BACKGROUND OF THE INVENTION

1. Technical Field

The present invention relates to a pattern-forming method.

2. Background Art

In the field of microfabrication (e.g., production of integrated circuit devices), lithographic technology that enables microfabrication with a line width of 0.1 μm or less has been desired to achieve a higher degree of integration. A lithographic process has utilized near ultraviolet rays (e.g., i-line). However, it is difficult to implement sub-quarter-micron microfabrication using near ultraviolet rays. Therefore, use of radiation having a shorter wavelength has been studied to enable microfabrication with a line width of 0.1 μm or less. Examples of such radiation include deep ultraviolet rays (e.g., mercury line spectrum and excimer laser light), X-rays, electron beams, and the like. In particular, technology that utilizes KrF excimer laser light (wavelength: 248 nm) or ArF excimer laser light (wavelength: 193 nm) has attracted attention.

As a resist that is suitable for excimer laser light, various resists (chemically-amplified resist) that utilize a chemical amplification effect due to an acid-dissociable functional group-containing component and a component that generates an acid upon irradiation (exposure) (hereinafter referred to as "acid generator") have been proposed. For example, a chemically-amplified resist that includes a resin containing a t-butyl ester group of a carboxylic acid or a t-butyl carbonate group of phenol, and an acid generator, has been proposed (Japanese Patent Application Publication (KOKAI) No. 5-232704, for example). This resist utilizes a phenomenon in which the t-butyl ester group or the t-butyl carbonate group contained in the resin dissociates due to an acid generated upon exposure to form an acidic group (e.g., carboxyl group or phenolic hydroxyl group), so that the exposed area of the resist film becomes readily soluble in an alkaline developer.

Such a lithographic process will be required to form a more minute pattern (e.g., a resist pattern with a line width of about 45 nm). A pattern with a line width of less than 45 nm may be formed by reducing the wavelength of the light source of the exposure system or increasing the numerical aperture (NA) of the lens. However, an expensive exposure system is required to reduce the wavelength of the light source. When increasing the numerical aperture (NA) of the lens, since the resolution and the depth of focus have a trade-off relationship, a decrease in depth of focus occurs when increasing the resolution.

In recent years, liquid immersion lithography has been proposed as lithographic technology that can solve the above problems (Japanese Patent Application Publication (KOKAI) No. 10-303114, for example). In liquid immersion lithography, a liquid high-refractive medium (immersion liquid) such as pure water or a fluorine-containing inert liquid is provided on at least on the resist film between the lens and the resist film on the substrate during exposure. In liquid immersion lithography, the optical space (path) is filled with a liquid (e.g., purified water) having a high refractive index (n) instead of an inert gas (e.g., air or nitrogen) so that the resolution can be increased without causing a decrease in depth of focus in the same manner as in the case of using a short-wavelength light source or a high NA lens. Since a resist pattern that exhibits a higher resolution and an excellent depth of focus can be inexpensively formed by liquid immersion lithography using a lens provided in an existing system, liquid immersion lithography has attracted attention.

However, it is considered that liquid immersion lithography can only be applied up to 45 nmhp. Therefore, technical development toward a 32 nmhp generation has been conducted. Moreover, a system (liquid immersion lithography system) used for liquid immersion lithography is very expensive, and may not be applied to a semiconductor production process.

A method that processes a given film formed on a first resist pattern to form a second resist pattern so that the film remains in the depression of the first resist pattern (Japanese Patent Application Publication (KOKAI) No. 2001-343757, for example), a resist pattern-forming method that forms a given film on a resist pattern formed by processing an upper-layer resist film formed on a lower-layer resist film (Japanese Patent Application Publication (KOKAI) No. 2002-110510, for example), a pattern-forming method that processes a processing target layer using a second patterning layer embedded to fill a first patterning layer formed by processing a resist layer formed on the processing target layer (Japanese Patent Application Publication (KOKAI) No. 2004-335873, for example), and the like have been disclosed as a method that enables finer patterning. However, a specific and practical method, material, etc. that improve such methods have not been proposed.

SUMMARY OF THE INVENTION

According to one aspect of the present invention, a pattern-forming method includes selectively exposing a resist layer that is formed using a positive-tone radiation-sensitive resin composition including a resin component (B) and an acid generator. The resist layer is developed to form a first pattern. An uncrosslinked embedded section is formed between adjacent areas of the first the pattern using a pattern-forming resin composition including a polymer (A) and a solvent. The polymer (A) has a carbon content higher than a carbon content of the resin component (B), does not include silicon atom in a molecule, and is crosslinkable due to an acid generated from the acid generator. The uncrosslinked embedded section is crosslinked in an area around an interface with the first pattern to form an array structure. The first pattern, a first crosslinked section, the uncrosslinked embedded section, and a second crosslinked section are repeatedly arranged in the array structure in this order. The first pattern and the uncrosslinked embedded section are removed to form a second pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
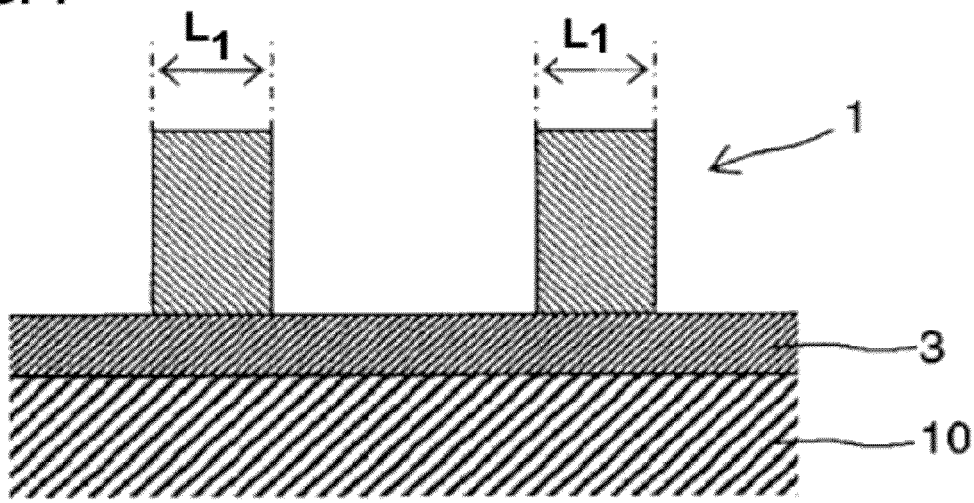
FIG. 1 is a cross-sectional view schematically showing an example of a first pattern.

The embodiments of the invention are described below. Note that the invention is not limited to the following embodiments. Various modifications and improvements may be made of the following embodiments within the scope of the invention based on the knowledge of a person having ordinary skill in the art.

Note that the term "pattern" used herein refer to an image formed by a resin, etc. that has remained after exposure and development. The term "pattern" may refer to an individual pattern or the entire pattern. The expression "around the interface" used herein refers to an area within about 5 nm from the interface.

Pattern-Forming Method

Step (i)

The step (i) includes applying a positive-tone radiation-sensitive resin composition (hereinafter may be referred to as "positive-tone resist composition" or "resist composition") to a substrate (e.g., silicon wafer), on which an organic lower-layer film is formed, by an appropriate application method (e.g., rotational coating, cast coating, or roll coating). A resist layer is thus formed of the resist composition. Note that the resist layer formed by applying the resist composition may optionally be prebaked (PB) to vaporize the solvent. The prebaking temperature is appropriately selected depending on the composition of the resist composition, but is normally 30 to 200° C., and preferably 50 to 150° C.

Examples of the organic lower-layer film formed on the substrate include "CT08" (manufactured by JSR Corporation), and the like. It is preferable that the organic lower-layer film exhibit a sufficient anti-reflective effect when patterning a resist. A pattern that is formed on the organic lower-layer film by the patterning formation method according to the embodiment of the invention and includes a given resin composition is transferred onto the organic lower-layer film by etching, and is then transferred onto an oxide film or the like formed under the organic lower-layer film. Therefore, it is preferable that the organic lower-layer film exhibit resistance to a fluorine-containing etching gas. Specific examples of a more preferable organic lower-layer film include an organic lower-layer film disclosed in JP-A-2002-214777, and the like.

A given area of the resist layer thus formed is exposed by applying radiation through a mask having a given pattern, for example, to form a pattern latent image area (i.e., post-exposure alkali-insoluble area). Radiation used for exposure is appropriately selected from visible rays, ultraviolet rays, deep ultraviolet rays, X-rays, electron beams, charged particle rays, and the like depending on the type of acid generator included in the resist composition. It is preferable to use deep ultraviolet rays such as ArF excimer laser light (wavelength: 193 nm) and KrF excimer laser light (wavelength: 248 nm), with ArF excimer laser light (wavelength: 193 nm) being particularly preferable. The exposure conditions (e.g., dose) are appropriately selected depending on the composition of the resist composition, the type of additive, and the like. In the embodiment of the invention, it is preferable to perform post-exposure bake (PEB) after exposure. An acid-dissociable group included in the resin component smoothly dissociates due to PEB. The PEB temperature is appropriately selected depending on the composition of the resist composition, but is normally 30 to 200° C., and preferably 50 to 170° C.

The exposed resist layer is developed so that the pattern latent image area is exposed. A positive-tone first pattern 1 shown in FIG. 1 that has a given line width $L_1$ (i.e., has a given space area) is thus formed on a substrate 10 through an organic lower-layer film 3. The line width $L_1$ of the first pattern 1 varies depending on the type of radiation applied, and the like. For example, the line width $L_1$ may be 95 to 155 nm when using an ArF excimer laser (wavelength: 193 nm).

A developer that may be used for development is preferably an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water. The concentration of the alkaline aqueous solution is normally 10 mass % or less. If the concentration of the alkaline aqueous solution exceeds 10 mass %, an unexposed area may be easily dissolved in the developer. After development using the alkaline aqueous solution, the resist film is normally washed with water, and dried.

An organic solvent may be added to the alkaline aqueous solution (developer). Examples of the organic solvent that may be added to the alkaline aqueous solution (developer) include ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide, and the like. These organic solvents may be used either individually or in combination.

The organic solvent is preferably added in an amount of 100 parts by volume or less based on 100 parts by volume of the alkaline aqueous solution. If the amount of the organic solvent exceeds 100 parts by volume based on 100 parts by volume of the alkaline aqueous solution, developability may decrease so that the exposed area may remain undeveloped. An appropriate amount of a surfactant or the like may also be added to the developer.

Step (ii)

The step (ii) includes applying a pattern-forming resin composition to the first pattern using an appropriate application method (e.g., rotational coating, cast coating, or roll coating). The pattern-forming resin composition is applied to cover the first pattern. After applying the pattern-forming resin composition, the applied composition is normally baked to form an uncrosslinked embedded section 7 that is formed of a pattern-forming resin composition 5 and positioned between the adjacent areas of the first pattern 1 (see FIG. 2). The step (ii) may be performed a plurality of times, as required.

The heating temperature when heating the pattern-forming resin composition applied to the first pattern is appropriately selected depending on the composition of the pattern-forming resin composition, but is normally 50 to 200° C., and preferably 80 to 180° C. When using a pattern-forming resin composition that includes a crosslinking agent, it is preferable to appropriately set the heating temperature depending on the type and the content of the crosslinking agent.

Figure 3:
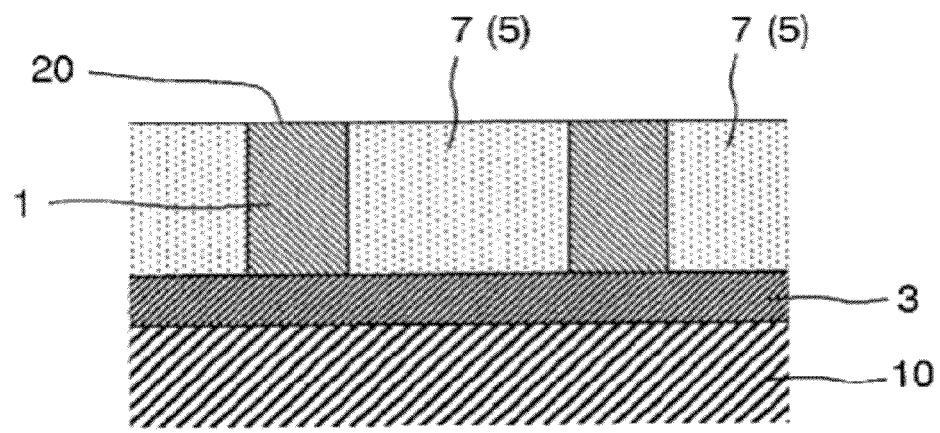
FIG. 3 is a cross-sectional view schematically showing an example of a state in which the upper side of a first pattern is exposed.

As shown in FIG. 3, an upper side 20 of the first pattern may be exposed by etching or the like after forming the uncrosslinked embedded section 7. For example, the pattern-forming resin composition 5 positioned over the upper side 20 of the first pattern is removed (etched back) using an etching system by utilizing $CF_4$ gas, $O_2$ gas, or the like. A wet etching method may be used instead of a dry etching method that utilizes $CF_4$ gas, $O_2$ gas, or the like. Alternatively, the pattern-forming resin composition 5 positioned over the upper side 20 of the first pattern may be removed mechanically.

Step (iii)

Figure 4:
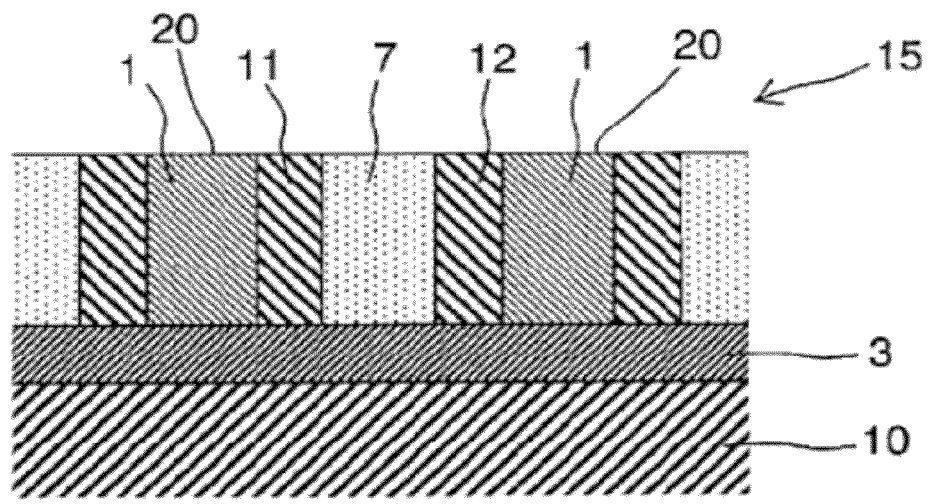
FIG. 4 is a cross-sectional view schematically showing an example of an array structure.

The step (iii) includes crosslinking the uncrosslinked embedded section 7 in an area around the interface with the first pattern 1 (see FIG. 3). The uncrosslinked embedded section 7 is formed of the pattern-forming resin composition that can be crosslinked due to an acid generated from the acid generator. Therefore, the uncrosslinked embedded section 7 is crosslinked only in an area around the interface with the first pattern 1. The uncrosslinked embedded section 7 may be crosslinked by applying light or heat, for example. An array structure 15 shown in FIG. 4 is thus formed, the first pattern 1, a first crosslinked section 11, the uncrosslinked embedded section 7, and a second crosslinked section 12 being repeatedly arranged in the array structure 15 in this order. Since the uncrosslinked embedded section 7 is crosslinked due to the acid generator included in the resist composition that forms the first pattern 1, the line width of the first crosslinked section 11 and the second crosslinked section 12 may be adjusted to a certain extent by appropriately adjusting the irradiation or heating conditions.

Figure 2:
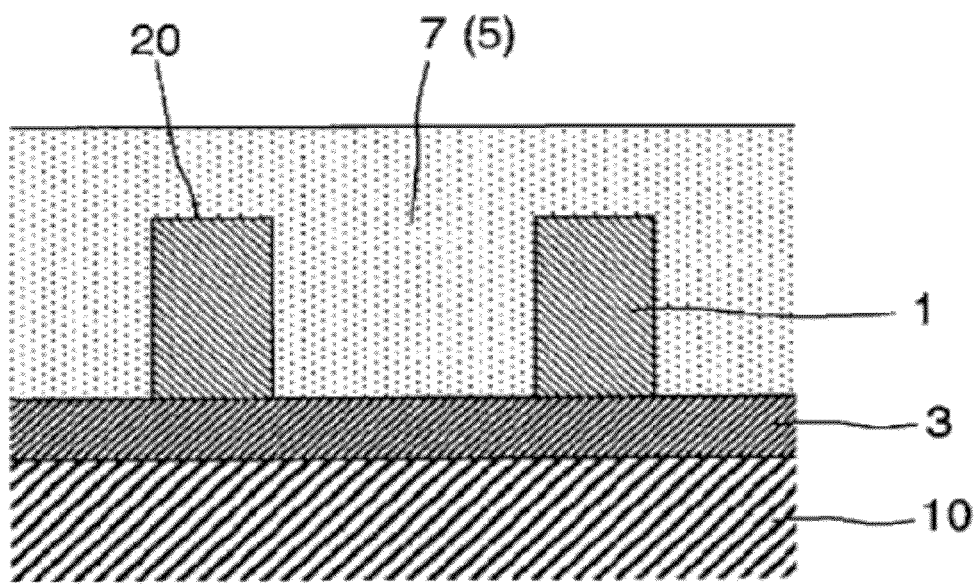
FIG. 2 is a cross-sectional view schematically showing an example of a state in which an uncrosslinked embedded section is formed.
Figure 7:
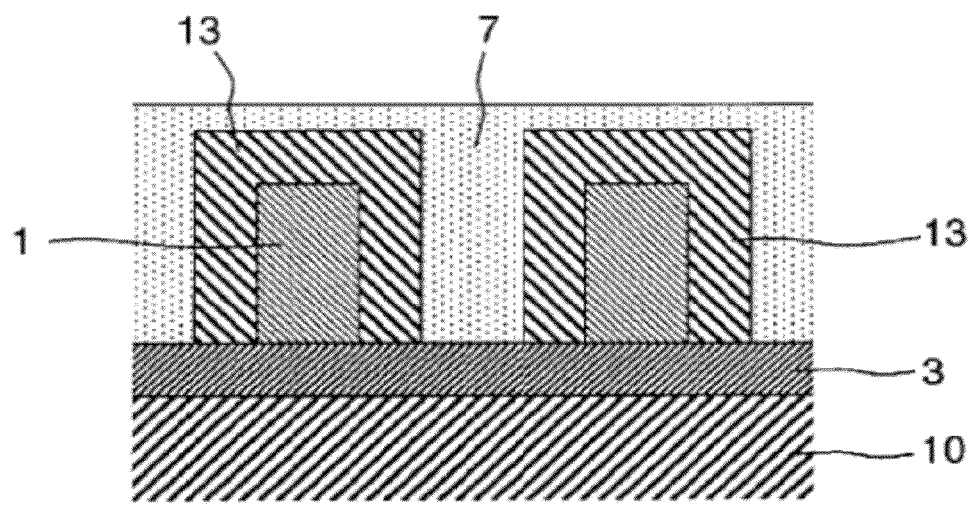
FIG. 7 is a cross-sectional view schematically showing another example of an array structure.

Note that the upper side 20 of the first pattern may not be exposed by etching or the like in the step (ii), and the uncrosslinked embedded section 7 may be crosslinked in an area around the interface with the first pattern 1 in a state in which the upper side 20 of the first pattern is covered with the pattern-forming resin composition 5 (see FIG. 2). In this case, the uncrosslinked embedded section 7 may be crosslinked by applying heat, for example. A crosslinked section 13 can thus be formed to surround the first pattern 1 (see FIG. 7). The upper side 20 of the first pattern is then exposed by removing the crosslinked section 13 and the pattern-forming resin composition 5 positioned over the upper side 20 of the first pattern by etching or the like to obtain the array structure 15 shown in FIG. 4.

Step (iv)

The step (iv) includes removing the first pattern 1 and the uncrosslinked embedded section 7. A second pattern 2 shown in FIG. 2 that includes a first crosslinked section 11 and a second crosslinked section 12 having a line width $L_2$, $L_3$, $L_4$, or $L_5$ can thus be formed.

The first pattern 1 and the uncrosslinked embedded section 7 may be removed by one of the following methods, for example. These methods include a method that removes the uncrosslinked embedded section 7, exposes the entire surface of the first pattern 1, and develops the first pattern 1 to remove the first pattern (first method), and a method that exposes the entire surface of the array structure, and develops the array structure to simultaneously remove the first pattern 1 and the uncrosslinked embedded section 7 (second method).

Figure 5:
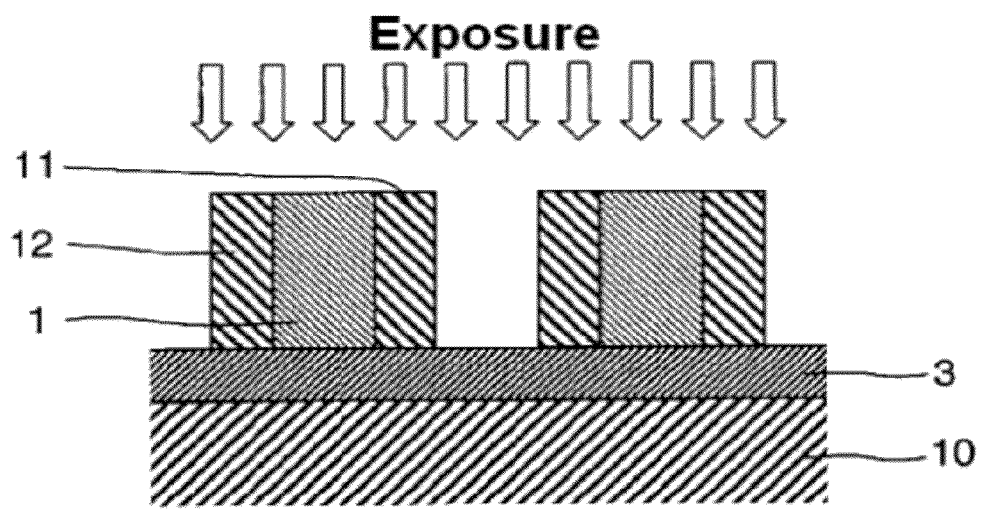
FIG. 5 is a cross-sectional view schematically showing an example of a state in which a first pattern is exposed.
Figure 6:
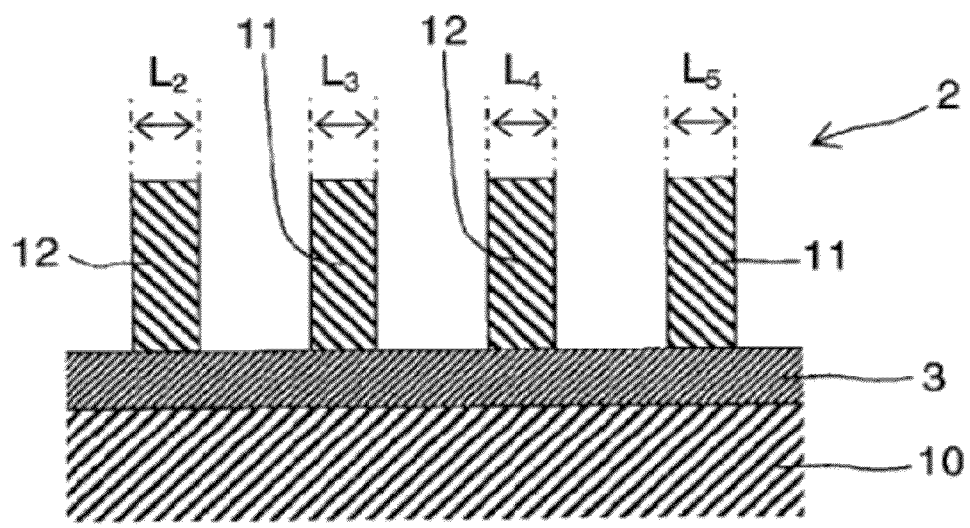
FIG. 6 is a cross-sectional view schematically showing an example of a second pattern.

When using the first method, the uncrosslinked embedded section 7 and the first pattern 1 are sequentially removed. Since the uncrosslinked embedded section 7 is soluble in the developer, the uncrosslinked embedded section 7 may be removed by washing with the developer, for example. As shown in FIG. 5, the entire surface of the first pattern 1 is exposed after removing the uncrosslinked embedded section 7 to form a space having a given width. The first pattern 1 thus becomes soluble in the developer or the like. Since the first crosslinked section 11 and the second crosslinked section 12 are scarcely soluble in the developer or the like, a stable state is maintained. The first pattern 1 is then developed using the developer to obtain a second pattern 2 shown in FIG. 6 that includes the first crosslinked section 11 and the second crosslinked section 12.

When using the second method, the entire surface of the array structure 15 (see FIG. 4) is exposed. The first pattern 1 thus becomes soluble in the developer or the like. Since the first crosslinked section 11 and the second crosslinked section 12 are scarcely soluble in the developer or the like, a stable state is maintained. The array structure 15 is then developed using the developer to simultaneously remove the first pattern 1 that has become soluble in the developer upon exposure and the uncrosslinked embedded section 7 that is soluble in the developer. The second pattern 2 shown in FIG. 6 that includes the first crosslinked section 11 and the second crosslinked section 12 is thus obtained.

When using the first method, the uncrosslinked embedded section 7 may be developed using the developer under conditions differing from those for the first pattern 1. Therefore, a second pattern with higher dimensional accuracy can be formed by employing optimum development conditions. When using the second method, since the array structure 15 is developed using the developer after exposing the entire surface of the array structure 15, the first pattern 1 and the uncrosslinked embedded section 7 can be simultaneously removed. Therefore, the second method is a convenient method.

Line widths $L_2$ to $L_4$ of the second pattern 2 thus formed are smaller than a line width $L_1$ of the first pattern 1 (see FIG. 1). The line width $L_1$ may be set to 95 to 155 nm, and the line widths $L_2$ to $L_4$ may be set to 20 to 80 nm, for example. Therefore, the pattern-forming method according to the embodiment of the invention can easily form a fine pattern having a line width as small as 40 nm or less by an exposure method that utilizes an ArF excimer laser without the need for an expensive system (e.g., liquid immersion lithography system). Therefore, the pattern-forming method according to the embodiment of the invention may be suitably employed for a semiconductor device production process, and is very useful.

Pattern-Forming Resin Composition

The pattern-forming resin composition that is used for the method according to the embodiment of the invention includes a polymer (A), and a solvent.

Polymer (A)

The polymer (A) that is included in the pattern-forming resin composition has a carbon content higher than that of a resin component (B) that is included in a positive-tone radiation resin composition described later, does not include a silicon atom in its molecule, and can be crosslinked due to an acid generated from the acid generator.

It is preferable that the polymer (A) include at least one repeating unit selected from repeating units shown by the following formulas (1) and (2), and have a polystyrene-reduced weight average molecular weight determined by gel permeation chromatography of 500 to 500,000.

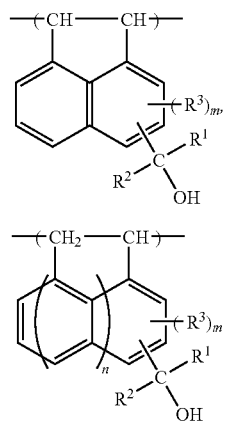

wherein $R^1$ and $R^2$ individually represent a hydrogen atom, an alkyl group having 1 to 3 carbon atoms, or an aryl group, $R^3$ represents an alkyl group having 1 to 3 carbon atoms, a vinyl group, an allyl group, or an aryl group, n is 0 or 1, and m is 0, 1, or 2.

In the formulas (1) and (2), $R^1$ and $R^2$ preferably represent a hydrogen atom, and n and m are preferably 0. These compounds may be used either individually or in combination.

Solvent

It is preferable that the solvent included in the pattern-forming resin composition used for the method according to the embodiment of the invention include an alcohol or an ether, and dissolve the uncrosslinked embedded section without substantially dissolving the first pattern, the first crosslinked section, and the second crosslinked section described later.

The molecular structure and the like of the alcohol or the ether are not particularly limited insofar as selective solubility is achieved. It is preferable to use an alcohol or an ether having 4 to 10 carbon atoms. Specific examples of the alcohol include butanol, 2-methyl-1-propanol, 2-methyl-2-propanol, 1,4-butanediol, pentanol, 1-methyl-1-butanol, 2-methyl-1-butanol, 3-methyl-1-butanol, cyclopentanol, hexanol, 4-methyl-2-pentanol, cyclohexanol, heptanol, cycloheptanol, octyl alcohol, nonyl alcohol, decyl alcohol, diethylene glycol, dipropylene glycol, triethylene glycol, tripropylene glycol, diethylene glycol monomethyl ether, triethylene glycol monomethyl ether, 4-methoxy-1-butanol, and the like. Among these, 4-methyl-2-pentanol is preferable. Specific examples of the ether include diethyl ether, dipropyl ether, dibutyl ether, dipentyl ether, diisopentyl ether, and the like. Among these, dibutyl ether is preferable. These alcohols and ethers may be used either individually or in combination.

The solvent preferably has a water content (water content relative to the total amount of the solvent) of 10 mass % or less, and more preferably 3 mass % or less. If the water content of the solvent exceeds 10 mass %, the resin component may not be sufficiently dissolved. The solvent is particularly preferably an anhydrous solvent that does not substantially contain water.

Additional Solvent

The pattern-forming resin composition used for the method according to the embodiment of the invention may include an additional solvent other than the above solvent in order to adjust workability when applying the pattern-forming resin composition to the first pattern so that that space between the adjacent areas of the first pattern is filled therewith. The additional solvent may be a solvent that allows uniform application of the pattern-forming resin composition without eroding the first pattern.

Specific examples of the additional solvent include cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, and butyl acetate; water; and the like. Among these, cyclic ethers, alkyl ethers of polyhydric alcohols, alkyl ether acetates of polyhydric alcohols, ketones, esters, and water are preferable.

The additional solvent is normally used in an amount of 30 mass % or less, and preferably 20 mass % or less, based on the total amount of the solvent. If the amount of the additional solvent is more than 30 mass %, the first pattern may be eroded so that intermixing with the pattern-forming resin composition may occur (i.e., the first pattern may be buried), for example. When using water as the additional solvent, water is preferably used in an amount of 10 mass % or less.

It is preferable that the pattern-forming resin composition used for the method according to the embodiment of the invention include a β-diketone. The storage stability of the resin composition may be improved by adding the β-diketone while suppressing a decrease in properties (e.g., film uniformity). Specific examples of the β-diketone include acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like. These β-diketones may be used either individually or in combination. The β-diketone is preferably used in an amount of 1 to 50 mass %, and more preferably 3 to 30 mass %, based on the total amount of the solvent.

Crosslinking Agent

The pattern-forming resin composition used for the method according to the embodiment of the invention may preferably include a crosslinking agent. A crosslinked section (second pattern) that is scarcely soluble or insoluble in the developer can be easily formed by adding the crosslinking agent. Specific examples of the crosslinking agent include crosslinking agents having a melamine skeleton, a benzoguanamine skeleton, a glycoluril skeleton, an epoxy skeleton, an oxetane skeleton, or a vinyl ether skeleton, and the like.

Specific examples of the crosslinking agent having a melamine skeleton or a benzoguanamine skeleton include MX-750 (manufactured by Sanwa Chemical Co., Ltd.) (3.7 methoxymethyl groups in average are substituted per triazine ring); MW-30 (manufactured by Sanwa Chemical Co., Ltd.) (5.8 methoxymethyl groups in average are substituted per triazine ring); methoxymethyl melamines such as Cymel 300, 301, 303, 350, 370, 771, 325, 327, 703, 712 (manufactured by Mitsui Cyanamid, Ltd.); methoxymethylbutoxymethyl melamines such as Cymel 235, 236, 238, 212, 253, 254 (manufactured by Mitsui Cyanamid, Ltd.); butoxymethyl melamines such as Cymel 506, 508 (manufactured by Mitsui Cyanamid, Ltd.); carboxyl group-containing methoxymethylisobutoxymethyl melamines such as Cymel 1141 (manufactured by Mitsui Cyanamid, Ltd.); methoxymethylethoxymethyl benzoguanamines such as Cymel 1123 (manufactured by Mitsui Cyanamid, Ltd.); methoxymethylbutoxymethyl benzoguanamines such as Cymel 1123-10 (manufactured by Mitsui Cyanamid, Ltd.); butoxymethyl benzoguanamines such as Cymel 1128 (manufactured by Mitsui Cyanamid, Ltd.); carboxyl group-containing methoxymethylethoxymethyl benzoguanamines such as Cymel 1125-80 (manufactured by Mitsui Cyanamid, Ltd.); and the like.

Specific examples of the crosslinking agent having a glycoluril skeleton include butoxymethyl glycoluril such as Cymel 1170, MX279 (manufactured by Mitsui Cyanamid, Ltd.); methylol glycoluril such as Cymel 1172 (manufactured by Mitsui Cyanamid, Ltd.); and the like.

Specific examples of the crosslinking agent having an epoxy skeleton include 1,6-hexanediol diglycidyl ether, 1,4-butanediol diglycidyl ether, cyclohexanedimethanol diglycidyl ether, trimethylolpropane polyglycidyl ether, diethylene glycol diglycidyl ether, and the like.

Specific examples of the crosslinking agent having an oxetane skeleton include di[1-ethyl(3-oxetanyl)]methyl ether, oxetanylsilsesquioxane, phenol novolac oxetane, and the like.

Specific examples of the crosslinking agent having a vinyl ether skeleton include allyl vinyl ether, 1,4-butanediol divinyl ether, nonanediol divinyl ether, cyclohexanediol divinyl ether, cyclohexanedimethanol divinyl ether, triethylene glycol divinyl ether, trimethylpropane trivinyl ether, pentaerythritol tetravinyl ether, and the like.

The crosslinking agent is preferably used in the pattern-forming resin composition used for the method according to the embodiment of the invention in an amount of 1 to 100 parts by mass, more preferably 1 to 50 parts by mass, and particularly preferably 1 to 30 parts by mass, based on 100 parts by mass of the resin component. If the amount of the crosslinking agent is less than 1 part by mass, the resin composition may be insufficiently cured so that pattern shrinkage may not occur. If the amount of the crosslinking agent is more than 100 parts by mass, the resin composition may be cured to a large extent so that the pattern may be buried.

The total amount of the resin component and the crosslinking agent is preferably 1 to 50 mass %, and more preferably 1 to 30 mass %, based on the total amount of the resin composition including the solvent. If the total amount of the resin component and the crosslinking agent is less than 1 mass %, flatness may deteriorate when embedding the resin composition between the adjacent areas of the pattern. If the total amount of the resin component and the crosslinking agent is more than 30 mass %, the viscosity of the resin composition may increase to a large extent, so that it may be difficult to embed the resin composition between the adjacent areas of a fine pattern.

Surfactant

A surfactant may be added to the pattern-forming resin composition used for the method according to the embodiment of the invention in order to increase the applicability, defoamability, leveling properties, and the like of the resin composition. Specific examples of the surfactant that may be added to the pattern-forming resin composition include fluorine-containing surfactants such as BM-1000, BM-1100 (manufactured by BM Chemie), Megafac F142D, F172, F173, F183 (manufactured by DIC Corporation), Fluorad FC-135, FC-170C, FC-430, FC-431 (manufactured by Sumitomo 3M, Ltd.), Surflon S-112, S-113, S-131, S-141, S-145 (manufactured by Asahi Glass Co., Ltd.), SH-28PA, SH-190, SH-193, SZ-6032, SF-8428 (manufactured by Dow Corning Toray Silicone Co., Ltd.), and the like. The surfactant is preferably used in an amount of 5 parts by mass or less based on 100 parts by mass of the resin component.

Positive-Tone Radiation-Sensitive Resin Composition

The resist composition (positive-tone radiation-sensitive resin composition) used in the pattern-forming method according to the embodiment of the invention is designed so that an acid-dissociable group dissociates due to an acid generated from the acid generator upon exposure, and the exposed area of the resist is dissolved and removed in an alkaline developer due to an increase in solubility in an alkaline developer to obtain a positive-tone resist pattern.

The resist composition preferably includes a resin (hereinafter may be referred to as "resin component (B)" or "resist resin") that includes a repeating unit shown by the following general formula (3).

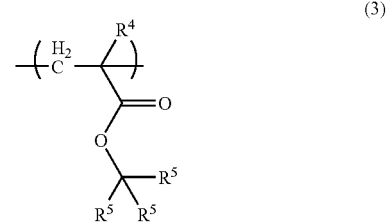

(3)

wherein $R^4$ represents a hydrogen atom or a methyl group, and $R^5$ individually represent a monovalent alicyclic hydrocarbon group having 4 to 20 carbon atoms, a derivative thereof, or a linear or branched alkyl group having 1 to 4 carbon atoms, provided that at least one of $R^5$ represents a monovalent alicyclic hydrocarbon group having 4 to 20 carbon atoms or a derivative thereof, or two of $R^5$ bond to form a divalent alicyclic hydrocarbon group having 4 to 20 carbon atoms or a derivative thereof together with the carbon atom that is bonded to the two $R^5$, and the remaining $R^5$ represents a linear or branched alkyl group having 1 to 4 carbon atoms, a monovalent alicyclic hydrocarbon group having 4 to 20 carbon atoms, or a derivative thereof.

Specific examples of the monovalent alicyclic hydrocarbon group having 4 to 20 carbon atoms represented by $R^5$ in the general formula (3) and the divalent alicyclic hydrocarbon group having 4 to 20 carbon atoms formed by two of $R^5$ include a group having an alicyclic ring derived from a cycloalkane such as norbornane, tricyclodecane, tetracyclododecane, adamantane, cyclobutane, cyclopentane, cyclohexane, cycloheptane, or cyclooctane; a group obtained by substituting the group having an alicyclic ring with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group; and the like. Among these, a group having an alicyclic ring derived from norbornane, tricyclodecane, tetracyclododecane, adamantane, cyclopentane, or cyclohexane, and a group obtained by substituting such a group with the above alkyl group are preferable.

Specific examples of the derivatives of the monovalent alicyclic hydrocarbon group having 4 to 20 carbon atoms represented by $R^5$ in the general formula (3) include groups having at least one substituent selected from a hydroxyl group; a carboxyl group; an oxo group (=O); a hydroxyalkyl group having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, and a 4-hydroxybutyl group; an alkoxy group having 1 to 4 carbon atoms such as a methoxy group, an ethoxy group, an n-propoxy group, an i-propoxy group, an n-butoxy group, a 2-methylpropoxy group, a 1-methylpropoxy group, and a t-butoxy group; a cyano group; and a cyanoalkyl group having 2 to 5 carbon atoms such as a cyanomethyl group, a 2-cyanoethyl group, a 3-cyanopropyl group, and a 4-cyanobutyl group; and the like. Among these, a hydroxyl group, a carboxyl group, a hydroxymethyl group, a cyano group, and a cyanomethyl group are preferable.

Specific examples of the linear or branched alkyl group having 1 to 4 carbon atoms represented by $R^5$ in the general formula (3) include a methyl group, an ethyl group, an n-propyl group, an i-propyl group, an n-butyl group, a 2-methylpropyl group, a 1-methylpropyl group, a t-butyl group, and the like. Among these, a methyl group and an ethyl group are preferable.

Specific examples of the group shown by "—C($R^5$)$_3$") in the general formula (3) include groups shown by the following general formulas (3a) to (3f).

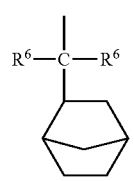
(3a)

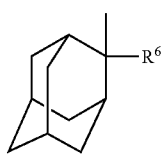
(3b)

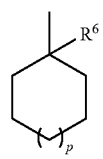
(3c)

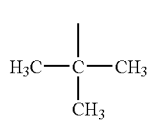
(3d)

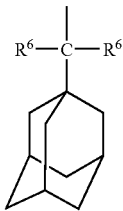
(3e)

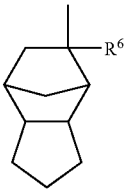
(3f)

wherein $R^6$ individually represents a linear or branched alkyl group having 1 to 4 carbon atoms, and p represents 0 or 1. Specific examples of the linear or branched alkyl group having 1 to 4 carbon atoms include a methyl group, an ethyl group, an n-propyl group, an i-propyl group, an n-butyl group, a 2-methylpropyl group, a 1-methylpropyl group, a t-butyl group, and the like. Among these, a methyl group and an ethyl group are preferable.

The group shown by "—COOC($R^5$)$_3$" in the general formula (3) dissociates due to an acid to form a carboxyl group and serves as an alkali-soluble moiety. The term "alkali-soluble moiety" refers to a (alkali-soluble) group that becomes an anion due to alkali. The term "acid-dissociable group" refers to a group in which the alkali-soluble moiety is protected by a protecting group, and which is not alkali-soluble until the protecting group dissociates due to an acid.

The resist resin is insoluble or scarcely soluble in alkali, but becomes alkali-soluble due to an acid. The expression "insoluble or scarcely soluble in alkali" means that a film that is formed only of a resin that includes a repeating unit shown by the general formula (3) has a thickness equal to or more than 50% of the initial thickness when developed under development conditions employed when forming a pattern using a resist film that is formed of a resist composition that includes a resin that includes a repeating unit shown by the general formula (3). The expression "alkali-soluble" means that 50% or more of the initial thickness of the film is lost when developed under the above development conditions.

The polystyrene-reduced weight average molecular weight (Mw) of the resist resin determined by gel permeation chromatography (GPC) is normally 1000 to 500,000, preferably 1000 to 100,000, and more preferably 1000 to 50,000. If the Mw of the resist resin is less than 1000, the heat resistance of the resulting pattern may decrease. If the Mw of the resist resin is more than 500,000, developability may decrease. The ratio (Mw/Mn) of the Mw to the polystyrene-reduced number average molecular weight (Mn) of the resist resin determined by GPC is preferably 1 to 5, and more preferably 1 to 3. The content (solid content) of a low-molecular-weight component that contains a monomer as the main component and is included in the resist resin is preferably 0.1 mass % or less based on the total amount of the resist resin. The content of the low-molecular-weight component may be determined by high-performance liquid chromatography (HPLC), for example.

Production of Resist Resin

The resist resin may be prepared by polymerizing a monomer component that includes a polymerizable unsaturated monomer corresponding to the desired repeating unit in an appropriate solvent optionally in the presence of a chain transfer agent using a radical polymerization initiator (e.g., hydroperoxide, dialkyl peroxide, diacyl peroxide, or azo compound).

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; alcohols such as methanol, ethanol, 1-propanol, 2-propanol, 1-butanol, 2-butanol, isobutanol, 1-pentanol, 3-pentanol, 4-methyl-2-pentanol, o-chlorophenol, and 2-(1-methylpropyl)phenol; ketones such as acetone, 2-butanone, 3-methyl-2-butanone, 4-methyl-2-pentanone, 2-heptanone, cyclopentanone, cyclohexanone, and methylcyclohexanone; and the like. These solvents may be used either individually or in combination.

The polymerization temperature is normally 40 to 150° C., and preferably from 50 to 120° C. The polymerization time is normally 1 to 48 hours, and preferably 1 to 24 hours. It is preferable that the resist resin have an impurity (e.g., halogen and metal) content as low as possible in order to improve sensitivity, resolution, process stability, pattern profile, and the like. The resist resin may be purified by a chemical purification method (e.g., washing with water or liquid-liquid extraction) or a combination of the chemical purification method and a physical purification method (e.g., ultrafiltration or centrifugation), for example.

Acid Generator

The positive-tone resist composition used in the embodiment of the invention includes the acid generator. The acid generator is preferably a compound that has a structure shown by the following general formula (4) and is decomposed upon exposure.

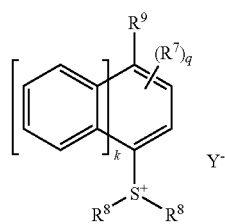

(4)

In the general formula (4), $R^9$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, and $R^7$ represents a linear or branched alkyl or alkoxy group having 1 to 10 carbon atoms, or a linear, branched, or cyclic alkanesulfonyl group having 1 to 10 carbon atoms.

In the general formula (4), $R^8$ individually represent a linear or branched alkyl group having 1 to 10 carbon atoms, a substituted or unsubstituted phenyl group, or a substituted or unsubstituted naphthyl group, provided that the two $R^8$ may bond to form a substituted or unsubstituted divalent group having 2 to 10 carbon atoms, k represents an integer from 0 to 2, $Y^-$ represents an anion shown by $R^{10}C_tF_{2t}SO_3^-$ (wherein $R^{10}$ represents a fluorine atom or a substituted or unsubstituted hydrocarbon group having 1 to 12 carbon atoms, and t represents an integer from 1 to 10), and q represents an integer from 0 to 10.

Examples of the linear or the branched alkyl group having 1 to 10 carbon atoms represented by $R^7$, $R^8$, and $R^9$ in the general formula (4) include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like. Among these, a methyl group, an ethyl group, an n-butyl group, a t-butyl group, and the like are preferable.

Examples of the linear or branched alkoxy group having 1 to 10 carbon atoms represented by $R^7$ and $R^8$ in the general formula (4) include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like. Among these, a methoxy group, an ethoxy group, an n-propoxy group, an n-butoxy group, and the like are preferable.

Examples of the linear or branched alkoxycarbonyl group having 2 to 11 carbon atoms represented by $R^9$ in the general formula (4) include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, a n-nonyloxycarbonyl group, an n-decyloxycarbonyl group, and the like. Among these, a methoxycarbonyl group, an ethoxycarbonyl group, an n-butoxycarbonyl group, and the like are preferable.

Examples of the linear, branched, or cyclic alkanesulfonyl group having 1 to 10 carbon atoms represented by $R^7$ in the general formula (4) include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group, and the like. Among these, a methanesulfonyl group, an ethanesulfonyl group, an n-propanesulfonyl group, an n-butanesulfonyl group, a cyclopentanesulfonyl group, a cyclohexanesulfonyl group, and the like are preferable. q is preferably an integer from 0 to 2.

Examples of the substituted or unsubstituted phenyl group represented by $R^8$ in the general formula (4) include a phenyl group, and phenyl groups substituted with a linear, branched, or cyclic alkyl group having 1 to 10 carbon atoms such as an o-tolyl group, an m-tolyl group, a p-tolyl group, a 2,3-dimethylphenyl group, a 2,4-dimethylphenyl group, a 2,5-dimethylphenyl group, a 2,6-dimethylphenyl group, a 3,4-dimethylphenyl group, a 3,5-dimethylphenyl group, a 2,4,6-trimethylphenyl group, a 4-ethylphenyl group, a 4-t-butylphenyl group, 4-cyclohexylphenyl group, and a 4-fluorophenyl group; groups obtained by substituting the above phenyl group or the above alkyl-substituted phenyl group with at least one group selected from a hydroxyl group, a carboxyl group, a cyano group, a nitro group, an alkoxy group, an alkoxyalkyl group, an alkoxycarbonyl group, and an alkoxycarbonyloxy group; and the like. Examples of the alkoxy group as a substituent for the phenyl group and the alkyl-substituted phenyl group include linear, branched, or cyclic alkoxy groups having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group, and the like.

Examples of the alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group, and the like. Examples of the alkoxycarbonyl group include linear, branched, or cyclic alkoxycarbonyl groups having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group, and the like.

Examples of the alkoxycarbonyloxy group include linear, branched, or cyclic alkoxycarbonyloxy groups having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group, and the like. The substituted or unsubstituted phenyl group represented by $R^8$ in the general formula (4) is preferably a phenyl group, a 4-cyclohexylphenyl group, a 4-t-butylphenyl group, a 4-methoxyphenyl group, a 4-t-butoxyphenyl group, or the like.

Examples of the substituted or unsubstituted naphthyl group represented by $R^8$ in the general formula (4) include naphthyl groups that are substituted with a linear, branched, or cyclic alkyl group having 1 to 10 carbon atoms, such as a 1-naphthyl group, a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group; a group obtained by substituting the above naphthyl group or the above alkyl-substituted naphthyl group with at least one group selected from a hydroxyl group, a carboxyl group, a cyano group, a nitro group, an alkoxy group, an alkoxyalkyl group, an alkoxycarbonyl group, and an alkoxycarbonyloxy group; and the like. Specific examples of the alkoxy group, the alkoxyalkyl group, the alkoxycarbonyl group, and the alkoxycarbonyloxy group as a substituent include the groups illustrated in connection with the phenyl group and the alkyl-substituted phenyl group.

The divalent group having 2 to 10 carbon atoms formed by the two $R^8$ in the general formula (4) is preferably a group that forms a five- or six-membered ring, preferably a five-membered ring (i.e., tetrahydrothiophene ring), together with the sulfur atom in the general formula (4). Examples of the substituent for the divalent group include the groups illustrated as the substituent for the phenyl group and the alkyl-substituted phenyl group, such as a hydroxyl group, a carboxyl group, a cyano group, a nitro group, an alkoxyl group, an alkoxyalkyl group, an alkoxycarbonyl group, and an alkoxycarbonyloxy group. Note that it is preferable that $R^8$ in the general formula (4) be a methyl group, an ethyl group, a phenyl group, a 4-methoxyphenyl group, or a 1-naphthyl group, or bond to form a divalent group that forms a tetrahydrothiophene ring structure together with the sulfur atom.

Examples of the cation moiety in the general formula (4) include a triphenylsulfonium cation, a tri-1-naphthylsulfonium cation, a tri-tert-butylphenylsulfonium cation, a 4-fluorophenyl-diphenylsulfonium cation, a di-4-fluorophenyl-phenylsulfonium cation, a tri-4-fluorophenylsulfonium cation, a 4-cyclohexylphenyl-diphenylsulfonium cation, a 4-methanesulfonylphenyl-diphenylsulfonium cation, a 4-cyclohexanesulfonyl-diphenylsulfonium cation, a 1-naphthyldimethylsulfonium cation, a 1-naphthyldiethylsulfonium cation, a 1-(4-hydroxynaphthyl)dimethylsulfonium cation, a 1-(4-methylnaphthyl)dimethylsulfonium cation, a 1-(4-methylnaphthyl)diethylsulfonium cation, a 1-(4-cyanonaphthyl)dimethylsulfonium cation, a 1-(4-cyanonaphthyl)diethylsulfonium cation, a 1-(3,5-dimethyl-4-hydroxyphenyl)tetrahydrothiophenium cation, a 1-(4-methoxynaphthyl)tetrahydrothiophenium cation, a 1-(4-ethoxynaphthyl)tetrahydrothiophenium cation, a 1-(4-n-propoxynaphthyl)tetrahydrothiophenium cation, a 1-(4-n-butoxynaphthyl)tetrahydrothiophenium cation, a 2-(7-methoxynaphthyl)tetrahydrothiophenium cation, a 2-(7-ethoxynaphthyl)tetrahydrothiophenium cation, a 2-(7-n-propoxynaphthyl)tetrahydrothiophenium cation, a 2-(7-n-butoxynaphthyl)tetrahydrothiophenium cation, and the like.

The group "—$C_tF_{2t}$—" in the anion ($R^{10}C_tF_{2t}SO_3^-$) represented by $Y^-$ in the general formula (4) is a perfluoroalkyl group having n carbon atoms. The perfluoroalkyl group may be linear or branched. t is preferably 1, 2, 4, or 8. The substituted or unsubstituted hydrocarbon group having 1 to 12 carbon atoms represented by $R^{10}$ is preferably an alkyl group, a cycloalkyl group, or a bridged alicyclic hydrocarbon group having 1 to 12 carbon atoms. Specific examples of the substituted or unsubstituted hydrocarbon group having 1 to 12 carbon atoms represented by $R^{10}$ include a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, an adamantyl group, and the like.

Examples of a preferable anion moiety in the general formula (4) include a trifluoromethanesulfonate anion, a perfluoro-n-butanesulfonate anion, a perfluoro-n-octanesulfonate anion, a 2-bicyclo[2.2.1]hept-2-yl-1,1,2,2-tetrafluoroethanesulfonate anion, a 2-bicyclo[2.2.1]hept-2-yl-1,1-difluoroethanesulfonate anion, and the like.

These acid generators may be used either individually or in combination. Note that an additional acid generator other than the above acid generators may also be used. Specific examples of the additional acid generator include onium salt compounds, halogen-containing compounds, diazoketone compounds, sulfone compounds, sulfonate compounds, and the like.

Examples of the onium salt compounds include iodonium salts, sulfonium salts, phosphonium salts, diazonium salts, pyridinium salts, and the like. Specific examples of the onium salt compounds include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, and the like.

Examples of the halogen-containing compounds include haloalkyl group-containing hydrocarbon compounds, haloalkyl group-containing heterocyclic compounds, and the like. Specific examples of the halogen-containing compounds include (trichloromethyl)-s-triazine derivatives such as phenylbis(trichloromethyl)-s-triazine, 4-methoxyphenylbis(trichloromethyl)-s-triazine, 1-naphthylbis(trichloromethyl)-s-triazine, 1,1-bis(4-chlorophenyl)-2,2,2-trichloroethane, and the like.

Examples of the diazoketone compounds include 1,3-diketo-2-diazo compounds, diazobenzoquinone compounds, diazonaphthoquinone compounds, and the like. Specific examples of the diazoketone compounds include 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris(4-hydroxyphenyl)ethane, and the like.

Examples of the sulfone compounds include β-ketosulfone, β-sulfonylsulfone, α-diazo compounds of these compounds, and the like. Specific examples of the sulfone compounds include 4-trisphenacylsulfone, mesitylphenacylsulfone, bis(phenylsulfonyl)methane, and the like.

Examples of the sulfonic acid compounds include alkyl sulfonates, alkylimide sulfonates, haloalkyl sulfonates, aryl sulfonates, imino sulfonates, and the like. Specific examples of the sulfonic acid compounds include benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hepta-2-yl-1,1,2,2-tetrafluoroethanesulfonylbicyclo[2.2.1]hept-5-ene-2,3-dica rbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hepta-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like.

Among these additional acid generators, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hepta-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hepta-2-yl-1,1,2,2-tetrafluoroethanesulfonate, cyclohexyl-2-oxocyclohexyl-methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hepta-2-yl-1,1,2,2-tetrafluoroethanesulfonylbicyclo[2.2.1]hept-5-ene-2,3-dica rbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hepta-2-yl-1,1,2,2-tetrafluoroethanesulfonyloxy)succinimide, 1,8-naphthalenedicarboxylic acid imide trifluoromethanesulfonate, and the like are preferable. These additional acid generators may be used either individually or in combination.

It is also preferable to use the acid generator having a structure shown by the general formula (4) and the additional acid generator in combination. When using the additional acid generator in combination with the acid generator having a structure shown by the general formula (4), the additional acid generator is normally used in an amount of 80 mass % or less, and preferably 60 mass % or less, based on the total amount of the acid generator having a structure shown by the general formula (4) and the additional acid generator.

The total amount of the acid generators used in the positive-tone resist composition is normally 0.1 to 20 parts by mass, and preferably 0.5 to 10 parts by mass, based on 100 parts by mass of the resist resin, from the viewpoint of ensuring that the resist composition exhibits sensitivity and developability. If the total amount of the acid generators is less than 0.1 parts by mass, the sensitivity and the developability of the positive-tone resist composition may decrease. If the total amount of the acid generators is more than 20 parts by mass, transparency to radiation may decrease, so that it may be difficult to form a rectangular pattern.

Acid Diffusion Controller

It is preferable that the positive-tone resist composition used in the embodiment of the invention include an acid diffusion controller. The acid diffusion controller controls diffusion of an acid generated from the acid generator upon exposure in the resist layer to suppress undesired chemical reactions in the unexposed area. The acid diffusion controller improves the storage stability of the resist composition and the resolution of the resist, and suppresses a change in line width of the pattern due to a variation in post-exposure delay (PED) from exposure to post-exposure bake. Therefore, a composition that exhibits excellent process stability can be obtained. A nitrogen-containing organic compound or a photodegradable base is preferably used as the acid diffusion controller. The photodegradable base is an onium salt compound that exhibits acid diffusion controllability upon decomposition due to exposure.

Nitrogen-Containing Organic Compound

Examples of the nitrogen-containing organic compound include a compound shown by the following formula (5) (hereinafter may be referred to as "nitrogen-containing compound (5I)"), a compound that includes two nitrogen atoms in the molecule (hereinafter may be referred to as "nitrogen-containing compound (5II)"), a polyamino compound that includes three or more nitrogen atoms in the molecule and a polymer thereof (hereinafter may be collectively referred to as "nitrogen-containing compound (5III)"), amide group-containing compounds, urea compounds, nitrogen-containing heterocyclic compounds, and the like.

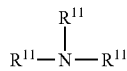

(5)

wherein $R^{11}$ individually represent a hydrogen atom, a substituted or unsubstituted linear, branched, or cyclic alkyl group, a substituted or unsubstituted aryl group, or a substituted or unsubstituted aralkyl group.

Preferable examples of the nitrogen-containing compound (5I) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substituted alkylamines such as 2,2',2''-nitrotriethanol; and aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline.

Preferable examples of the nitrogen-containing compound (5II) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Preferable examples of the nitrogen-containing compound (5III) include polyethyleneimine, polyallylamine, poly(2-dimethylaminoethylacrylamide), and the like.

Preferable examples of the amide group-containing compounds include N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminoocctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and N-t-butoxycarbonylpyrrolidine; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanuric acid, and the like.

Preferable examples of the urea compounds include urea, methylurea, 1,1-dimethylurea, 1,3-dimethylurea, 1,1,3,3-tetramethylurea, 1,3-diphenylurea, tri-n-butylthiourea, and the like. Preferable examples of the nitrogen-containing heterocyclic compounds include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; and pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

Photodegradable Base

The photodegradable base is an onium salt compound that exhibits acid diffusion controllability upon decomposition due to exposure. Specific examples of the onium salt compound include sulfonium salt compounds shown by the following general formula (6) and iodonium salt compounds shown by the following general formula (7).

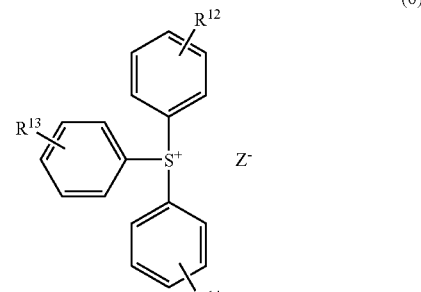

(6)

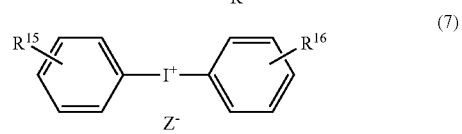

(7)

wherein $R^{12}$ to $R^{16}$ individually represent a hydrogen atom, an alkyl group, an alkoxyl group, a hydroxyl group, or a halogen atom, and $Z^-$ represents $OH^-$, $RCOO^-$, $RSO_3^-$ (wherein R represents an alkyl group, an aryl group, or an alkaryl group), or an anion shown by the following formula (8).

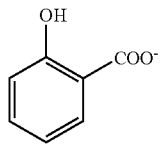

(8)

Specific examples of the sulfonium salt compounds and the iodonium salt compounds include triphenylsulfonium hydroxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis (4-t-butylphenyl)iodonium hydroxide, bis(4-t-butylphenyl) iodonium acetate, bis(4-t-butylphenyl)iodonium salicylate, 4-t-butylphenyl-4-hydroxyphenyliodonium hydroxide, 4-t-butylphenyl-4-hydroxyphenyl)iodonium acetate, 4-t-butylphenyl-4-hydroxyphenyl)iodonium salicylate, bis(4-t-butylphenyl)iodonium 10-camphorsulfonate, diphenyliodonium 10-camphorsulfonate, triphenylsulfonium 10-camphorsulfonate, 4-t-butoxyphenyldiphenylsulfonium 10-camphorsulfonate, and the like.

These acid diffusion controllers may be used either individually or in combination. The acid diffusion controller is normally used in an amount of 15 parts by mass or less, preferably 10 parts by mass or less, and still more preferably 5 parts by mass or less, based on 100 parts by mass of the resist resin. If the amount of the acid diffusion controller is more than 15 parts by mass, the resolution of the resist composition may decrease. If the amount of the acid diffusion controller is less than 0.001 parts by mass, the pattern shape or the dimensional accuracy may decrease depending on the process conditions.

Solvent

It is preferable that the positive-tone radiation-sensitive resin composition according to the embodiment of the invention be prepared by dissolving the resist resin, the acid generator, the acid diffusion controller, etc. in a solvent. The solvent is preferably at least one solvent selected from the group consisting of propylene glycol monomethyl ether acetate, 2-heptanone, and cyclohexanone (hereinafter referred to as "solvent (S)"). A solvent (hereinafter may be referred to as "additional solvent") other than the solvent (S) may also be used. It is also possible to use the solvent (S) and the additional solvent in combination.

Examples of the additional solvent include propylene glycol monoalkyl ether acetates such as propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, and 2-octanone; cyclic ketones such as cyclopentanone, 3-methylcyclopentanone, 2-methylcyclohexanone, 2,6-dimethylcyclohexanone, and isophorone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; ethylene glycol monomethyl ether acetate, ethylene glycol monoethyl ether acetate, ethylene glycol mono-n-propyl ether acetate, propylene glycol methyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl acetate, ethyl benzoate, diethyl oxalate, diethyl maleate, γ-butyrolactone, ethylene carbonate, propylene carbonate, and the like.

Among these solvents, linear or branched ketones, cyclic ketones, propylene glycol monoalkyl ether acetates, alkyl 2-hydroxypropionates, alkyl 3-alkoxypropionates, γ-butyrolactone, and the like are preferable. These solvents may be used either individually or in combination.

When using the solvent (S) and the additional solvent in combination, the additional solvent is normally used in an amount of 50 mass % or less, preferably 30 mass % or less, and still more preferably 25 mass % or less, based on the total amount of the solvents. The solvent is included in the positive-tone resist composition in such an amount that the positive-tone resist composition normally has a solid content of 2 to 70 mass %, preferably 4 to 25 mass %, and more preferably 4 to 10 mass %.

The positive-tone resist composition may be prepared by dissolving each component in the solvent so that the total solid content is within the above range to obtain a homogenous solution, and filtering the solution through a filter having a pore size of about 0.2 μm, for example.

Additives such as a surfactant, a sensitizer, and an aliphatic additive may optionally be added to the positive-tone resist composition.

The surfactant improves the applicability, striation, developability, etc. of the positive-tone resist composition. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination. The surfactant is normally used in an amount of 2 parts by mass or less based on 100 parts by mass of the resist resin.

The sensitizer absorbs the energy of radiation, and transmits the absorbed energy to the acid generator so that the amount of acid generated increases. The sensitizer improves the apparent sensitivity of the resist composition. Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination. A dye or a pigment visualizes the latent image in the exposed area to reduce the effects of halation during exposure. An adhesion improver improves adhesion to a substrate. The sensitizer is normally used in an amount of 50 parts by mass or less based on 100 parts by mass of the resist resin.

Examples of the alicyclic additive that may be added to the positive-tone resist composition include alicyclic additives including an acid-dissociable group, alicyclic additives not including an acid-dissociable group, and the like. These alicyclic additives improve dry etching resistance, the pattern shape, adhesion to a substrate, and the like. Specific examples of the alicyclic additives include adamantane derivatives such as 1-adamantanecarboxylic acid, 2-adamantanone, t-butyl-1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[4.4.0.1$^{2,5}$.1$^{7,10}$]dodecane; and the like.

These alicyclic additives may be used either individually or in combination. The alicyclic additive is normally used in an amount of 50 parts by mass or less, and preferably 30 parts by mass or less, based on 100 parts by mass of the resist resin. If the amount of the alicyclic additive is more than 50 parts by mass based on 100 parts by mass of the resist resin, the heat resistance of the resulting resist may decrease. Examples of other additives include an alkali-soluble resin, a low-molecular-weight alkali solubility controller that includes an acid-dissociable protecting group, a halation inhibitor, a preservation stabilizer, an antifoaming agent, and the like.

EXAMPLES

The invention is further described below by way of examples. Note that the invention is not limited to the following examples. In the examples and comparative examples, the unit "parts" refers to "parts by weight", and the unit "%" refers to "mass %", unless otherwise indicated.

Synthesis Example 1

Polymer (IA) Including Repeating Unit Derived from Hydroxymethylacenaphthylene

A polymer (IA) including a repeating unit derived from hydroxymethylacenaphthylene was prepared, and a pattern-forming resin composition (I) was prepared using the polymer (IA).

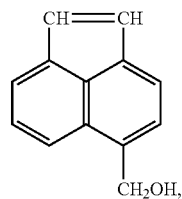
(P-1-1)

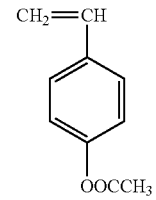
(P-1-2)

A separable flask equipped with a thermometer was charged with a mixture of 9 parts by mass of 4-acetoxystyrene (P-1-2), 6 parts by mass of 5-hydroxymethylacenaphthylene (P-1-1), 180 parts by mass of propylene glycol methyl ether, and 5 parts by mass of dimethyl-2,2'-azobisisobutyrate in a nitrogen atmosphere. The mixture was polymerized at 60° C. for six hours with stirring. The reaction solution was then heated at 95° C. for one hour. After concentrating the reaction solution to half under reduced pressure, the reaction solution was added to a large quantity of heptane to re-precipitate the reaction product. A separable flask equipped with a thermometer was charged with the entire reaction product (solid), 100 parts by mass of tetrahydrofuran, 100 parts by mass of methanol, 7 parts by mass of triethylamine, and 3 parts by mass of water in a nitrogen atmosphere. The mixture was heated and refluxed for seven hours with stirring. After concentrating the reaction solution to half under reduced pressure, the reaction solution was added to a large quantity of heptane to obtain 18 g of a solid. The Mw of the resulting polymer was 1800. The Mw of the polymer was measured by gel permeation chromatography (GPC) using GPC columns (manufactured by Tosoh Corp., G2000HXL×2, G3000HXL×1, G4000HXL×1) at a flow rate of 1.0 ml/min and a column temperature of 40° C. (eluant: tetrahydrofuran, standard: monodispersed polystyrene).

Synthesis Example 2

Polymer (IIA) Including Repeating Unit Derived from Hydroxymethylstyrene

A polymer (IIA) including a repeating unit derived from hydroxymethylstyrene was prepared, and a pattern-forming resin composition (II) was prepared using the polymer (IIA).

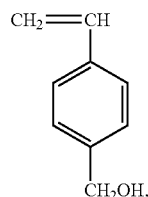
(P-2-1)

-continued

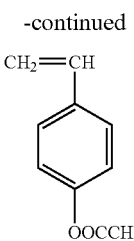

(P-2-2)

A separable flask equipped with a thermometer was charged with a mixture of 9 parts by mass of 4-acetoxystyrene (P-2-2), 6 parts by mass of 4-hydroxymethylstyrene (P-2-1), 180 parts by mass of propylene glycol methyl ether, and 5 parts by mass of dimethyl-2,2'-azobisisobutyrate in a nitrogen atmosphere. The mixture was polymerized at 60° C. for six hours with stirring. The reaction solution was then heated at 95° C. for one hour. After concentrating the reaction solution to half under reduced pressure, the reaction solution was added to a large quantity of heptane to re-precipitate the reaction product. A separable flask equipped with a thermometer was charged with the resulting reaction product, 100 parts by mass of tetrahydrofuran, 100 parts by mass of methanol, 7 parts by mass of triethylamine, and 3 parts by mass of water in a nitrogen atmosphere. The mixture was heated and refluxed for seven hours with stirring. After concentrating the reaction solution to half under reduced pressure, the reaction solution was added to a large quantity of heptane to obtain 18 g of a solid. The Mw of the resulting polymer measured in the same manner as in Synthesis Example 1 was 2000.

Pattern-Forming Resin Composition (I)

10 parts by mass of the polymer (IA) and 0.1 parts by mass of bis(4-t-butylphenyl)iodonium nonafluoro-n-butanesulfonate were dissolved in 190 parts by mass of 4-methyl-2-pentanol to prepare a pattern-forming resin composition (I).

Pattern-Forming Resin Composition (II)

10 parts by mass of the polymer (IIA) and 0.1 parts by mass of bis(4-t-butylphenyl)iodonium nonafluoro-n-butanesulfonate were dissolved in 190 parts by mass of 4-methyl-2-pentanol to prepare a pattern-forming resin composition (II).

Preparation of Evaluation Substrate A

An antireflective film-forming composition was spin-coated onto an 8-inch silicon wafer, and heated on a hot plate at 200° C. for 120 seconds to form an antireflective film (thickness: 36 nm) on the silicon wafer. A resist composition ("JSR ArF AIM5056JN" manufactured by JSR Corporation) was spin-coated onto the antireflective film, and pre-baked (PB, 110° C., 90 seconds) to form a resist layer (thickness: 180 nm). The resist layer was exposed using an ArF liquid immersion lithography system ("NSR-S306C" manufactured by Nikon Corporation) (NA: 0.78, σ: 0.85, 2/3Ann). After performing puddle development (60 seconds) using an LD nozzle of a system "CLEAN TRACK ACT8", the resist layer was rinsed with ultrapure water, and spin-dried at 4000 rpm for 15 seconds to obtain an evaluation substrate A on which a first pattern was formed. The evaluation substrate A was observed using a scanning electron microscope ("S9360" manufactured by Hitachi High-Tech Fielding Corporation). It was confirmed that an 80 nm line/120 nm space first pattern was formed.

Preparation of Evaluation Substrate D

A lower-layer antireflective film composition ("CT08" manufactured by JSR Corporation) was spin-coated onto an 8-inch silicon wafer using a system "CLEAN TRACK ACT8" (manufactured by Tokyo Electron Ltd.), and baked at 300° C. to form a film (thickness: 300 nm). An intermediate film composition ("SOG080" manufactured by JSR Corporation) was spin-coated onto the resulting film, and baked at 300° C. to form a film (thickness: 45 nm). A resist composition ("JSR ArF AIM5056JN" manufactured by JSR Corporation) was spin-coated onto the resulting film, and pre-baked (PB, 110° C., 90 seconds) to form a resist layer (thickness: 180 nm). The resist layer was exposed using an ArF liquid immersion lithography system ("NSR-S306C" manufactured by Nikon Corporation) (NA: 0.78, σ: 0.85, 2/3Ann). After performing puddle development (60 seconds) using an LD nozzle of a system "CLEAN TRACK ACT8", the resist layer was rinsed with ultrapure water, and spin-dried at 4000 rpm for 15 seconds to obtain an evaluation substrate D on which a first pattern was formed. The evaluation substrate D was observed using a scanning electron microscope ("S9360" manufactured by Hitachi High-Tech Fielding Corporation). It was confirmed that an 80 nm line/120 nm space first pattern was formed.

Residual Performance of First Pattern

The pattern-forming resin composition (I) or (II) was spin-coated onto the evaluation substrate A or D using a system "CLEAN TRACK ACT8". The line width of the first pattern formed on the evaluation substrate and the line width of the first pattern after applying the pattern-forming resin composition (I) or (II) were measured using a scanning electron microscope ("S4800" manufactured by Hitachi High-Tech Fielding Corporation). The residual performance of the first pattern was evaluated based on a change in line width of the first pattern. The evaluation results are shown below.

Good: A change in line width was less than 5 nm.

Bad: A change in line width was 5 nm or more.

Note that the symbol "+" indicates that the line width increased, and the symbol "−" indicates that the line width decreased.

TABLE 1

| | Evaluation substrate | Pattern-forming resin composition | Residual performance of first pattern |
|---|---|---|---|
| Example 1 | A | (I) | Good (−4 nm) |
| Example 2 | A | (II) | Good (−4 nm) |
| Example 3 | D | (I) | Good (−4 nm) |
| Example 4 | D | (II) | Good (−4 nm) |

Filling Capability

The pattern-forming resin composition (I) or (II) was spin-coated onto the evaluation substrate A or D using a system "CLEAN TRACK ACT8", and baked at 100° C. for 60 seconds to fill the space between the adjacent areas of the first pattern with the resin composition (maximum thickness: 300 nm). The cross section of the area filled with the resin composition was observed using a scanning electron microscope ("S-4800" manufactured by Hitachi High-Technologies, Inc.). The filling capability was evaluated in accordance with the following criteria. The evaluation results are shown below.

Good: Voids due to bubbles or the like were not observed in the area filled with the resin composition.

Bad: Voids due to bubbles or the like were observed in the area filled with the resin composition.

TABLE 2

|  | Evaluation substrate | Pattern-forming resin composition | Filling capability |
| --- | --- | --- | --- |
| Example 5 | A | (I) | Good |
| Example 6 | A | (II) | Good |
| Example 7 | D | (I) | Good |
| Example 8 | D | (II) | Good |

Curability and Separability

The pattern-forming resin composition (I) or (II) was spin-coated onto the evaluation substrate A using a system "CLEAN TRACK ACT8", and baked at 100° C. for 60 seconds to fill the space between the adjacent areas of the first pattern with the resin composition (maximum thickness: 300 nm). After baking the resin composition at 150° C. for 90 seconds, the resin composition was subjected to puddle development (60 seconds, developer: 2.38 mass % TMAH aqueous solution) using an LD nozzle of the system "CLEAN TRACK ACT8", and rinsed with ultrapure water. The evaluation substrate was then spin-dried at 4000 rpm for 15 seconds to obtain an evaluation substrate B or C. The cross section of the evaluation substrate B or C was observed, and the curability and separability of the resin composition were evaluated in accordance with the following criteria. The evaluation results are shown below. The pattern-forming resin composition (I) or (II) was applied to the evaluation substrate B, and treated in the same manner as described above to obtain an evaluation substrate E or F.

When the pattern-forming resin composition was cured due to the acid contained in the resist film so that the line width increased by 5 nm or more as compared with the first pattern, curability was evaluated as "Good". When the entire pattern-forming resin composition provided between the adjacent areas of the first pattern was cured (no space was formed), separability was evaluated as "Bad".

Good: The line width of the first pattern increased, and the space became narrow (curability and separability: good).

Bad: The line width of the first pattern did not change, or the space was filled (curability and separability: bad).

TABLE 3

|  | Evaluation substrate | Pattern-forming resin composition | Curability and separability |
| --- | --- | --- | --- |
| Example 9 | B | (I) | Good |
| Example 10 | C | (II) | Good |
| Example 11 | E | (I) | Good |
| Example 12 | F | (II) | Good |

Separability of First Pattern

The evaluation substrate B, C, E, or F was subjected to a puddle treatment for 60 seconds using cyclohexanone as a resist stripper utilizing a system "CLEAN TRACK ACT8", and spin-dried at 4000 rpm for 15 seconds to obtain an evaluation substrate. The cross section of the area of each evaluation substrate filled with the resin composition was observed using a scanning electron microscope ("S-4800" manufactured by Hitachi High-Technologies, Inc.). The separability of the first pattern was evaluated in accordance with the following criteria. The evaluation results are shown below.

Good: The first pattern was separated.

Bad: The first pattern was not separated, or the crosslinked area of the resin composition did not remain.

TABLE 4

|  | Evaluation substrate | Pattern-forming resin composition | Separability of first pattern |
| --- | --- | --- | --- |
| Example 13 | B | (I) | Good |
| Example 14 | C | (II) | Good |
| Example 15 | E | (I) | Good |
| Example 16 | F | (II) | Good |

The adjacent areas of the first pattern on each substrate were observed using a scanning electron microscope ("S-4800" manufactured by Hitachi High-Technologies, Inc.). It was confirmed that a 20 nm line/80 nm space second pattern was formed from the 80 nm line/120 nm space second pattern of the evaluation substrate A or D.

Etching Performance and Carbon Content

The pattern-forming resin composition (I), the pattern-forming resin composition (II), or the organic ArF resist composition (AIM5056JN) (comparative example) was applied to an 8-inch wafer, and baked at 100° C. The etching resistance of the resulting film was compared under conditions shown in Table 5. The pattern-forming resin composition (I), the pattern-forming resin composition (II), or the organic ArF resist composition (AIM5056JN) (comparative example) was applied to an 8-inch wafer, and baked at 100° C. The carbon content of the film was measured by Rutherford Backscattering Spectrometry (RBS). The results are shown below.

TABLE 5

|  |  | Pattern-forming resin composition (I) | Pattern-forming resin composition (II) | Comparative Example (AIM5056JN) |
| --- | --- | --- | --- | --- |
| Carbon content (atom %) RBS |  | 53 | 49 | 31 |
| Etching Performance (nm/min) | Etching condition $O_2$ 20 Pa, 200 W | 350 | 370 | 470 |
|  | Etching condition $CF_4/O_2/Ar$ 20 Pa, 200 W | 210 | 230 | 260 |

As is clear from the above results, the film formed of the pattern-forming resin composition (I) or (II) exhibited excellent etching resistance as compared with the film formed of the ArF resist composition (comparative example).

The pattern-forming method according to the embodiment of the invention can conveniently and efficiently form a finer pattern. Therefore, the pattern-forming method according to the embodiment of the invention may be applied to a semiconductor production process.

The pattern-forming method according to the embodiment of the invention can conveniently and efficiently form a finer resist pattern.

The pattern-forming method according to the embodiment of the invention can form a fine pattern with high accuracy, and can advantageously and economically form a pattern that exceeds a wavelength limit. Therefore, the pattern-forming method according to the embodiment of the invention may be

What is claimed as new and is desired to be secured by Letters Patent of the United States is:

1. A pattern-forming method comprising:
selectively exposing a resist layer that is formed using a positive-tone radiation-sensitive resin composition comprising a resin component (B) and an acid generator;
developing the resist layer to form a first pattern;
forming an uncrosslinked embedded section between adjacent areas of the first pattern using a pattern-forming resin composition comprising a polymer (A) and a solvent, wherein the polymer (A) has a carbon content higher than a carbon content of the resin component (B), does not include silicon atom in a molecule, and is crosslinkable due to an acid generated from the acid generator;
crosslinking the uncrosslinked embedded section in an area around an interface with the first pattern to form an array structure, wherein the first pattern, a first crosslinked section, the uncrosslinked embedded section, and a second crosslinked section are repeatedly arranged in the array structure in this order; and
removing the first pattern and the uncrosslinked embedded section to form a second pattern.

2. The pattern-forming method according to claim 1, wherein the polymer (A) comprises at least one of repeating units shown by following formulas (1) and (2), and has a polystyrene-reduced weight average molecular weight determined by gel permeation chromatography of 500 to 500,000,

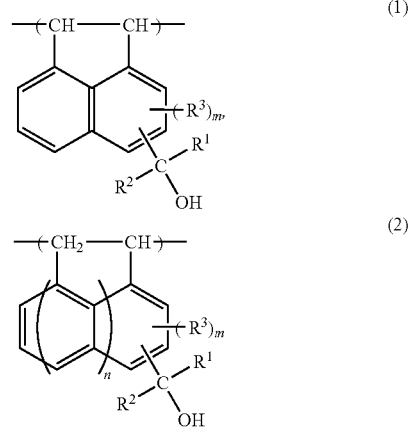

wherein $R^1$ and $R^2$ represent a hydrogen atom, an alkyl group having 1 to 3 carbon atoms, or an aryl group, $R^3$ represents an alkyl group having 1 to 3 carbon atoms, a vinyl group, an allyl group, or an aryl group, n is 0 or 1, and m is 0, 1, or 2.

3. The pattern-forming method according to claim 2, wherein $R^1$ and $R^2$ represent a hydrogen atom, and n and m are 0.

4. The pattern-forming method according to claim 3, wherein the forming step of forming the uncrosslinked embedded section includes uncovering an upper side of the first pattern.

5. The pattern-forming method according to claim 3, wherein the crosslinking step includes uncovering an upper side of the first pattern.

6. The pattern-forming method according to claim 3, wherein the removing step includes removing the uncrosslinked embedded section, exposing an entire surface of the first pattern, and developing the first pattern to remove the first pattern.

7. The pattern-forming method according to claim 3, wherein the removing step includes exposing an entire surface of the array structure, and developing the array structure to simultaneously remove the first pattern and the uncrosslinked embedded section.

8. The pattern-forming method according to claim 2, wherein the forming step of forming the uncrosslinked embedded section includes uncovering an upper side of the first pattern.

9. The pattern-forming method according to claim 2, wherein the crosslinking step includes uncovering an upper side of the first pattern.

10. The pattern-forming method according to claim 2, wherein the removing step includes removing the uncrosslinked embedded section, exposing an entire surface of the first pattern, and developing the first pattern to remove the first pattern.

11. The pattern-forming method according to claim 2, wherein the removing step includes exposing an entire surface of the array structure, and developing the array structure to simultaneously remove the first pattern and the uncrosslinked embedded section.

12. The pattern-forming method according to claim 1, wherein the forming step of forming the uncrosslinked embedded section includes uncovering an upper side of the first pattern.

13. The pattern-forming method according to claim 1, wherein the crosslinking step includes uncovering an upper side of the first pattern.

14. The pattern-forming method according to claim 1, wherein the removing step includes removing the uncrosslinked embedded section, exposing an entire surface of the first pattern, and developing the first pattern to remove the first pattern.

15. The pattern-forming method according to claim 1, wherein the removing step includes exposing an entire surface of the array structure, and developing the array structure to simultaneously remove the first pattern and the uncrosslinked embedded section.

* * * * *